United States Patent
Chuang et al.

(10) Patent No.: US 9,466,357 B2
(45) Date of Patent: Oct. 11, 2016

(54) CIRCUIT FOR MITIGATING WRITE DISTURBANCE OF DUAL-PORT SRAM

(71) Applicant: FARADAY TECHNOLOGY CORPORATION, Hsinchu (TW)

(72) Inventors: Ching-Te Chuang, Hsinchu (TW); Chien-Yu Lu, Hsinchu (TW); Ming-Ching Zheng, Hsinchu (TW); Ming-Hsien Tu, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 7 days.

(21) Appl. No.: 14/602,739

(22) Filed: Jan. 22, 2015

(65) Prior Publication Data

US 2016/0027500 A1    Jan. 28, 2016

(30) Foreign Application Priority Data

Jul. 24, 2014  (TW) .............................. 103125289 A

(51) Int. Cl.
| | |
|---|---|
| G11C 11/00 | (2006.01) |
| G11C 11/419 | (2006.01) |
| G11C 8/16 | (2006.01) |
| G11C 11/412 | (2006.01) |

(52) U.S. Cl.
CPC .............. *G11C 11/419* (2013.01); *G11C 8/16* (2013.01); *G11C 11/412* (2013.01)

(58) Field of Classification Search
CPC . G11C 11/412; G11C 11/413; G11C 11/419; G11C 8/16; G11C 7/22; G11C 7/1075
See application file for complete search history.

(56) References Cited

U.S. PATENT DOCUMENTS

| | | | |
|---|---|---|---|
| 7,894,296 B2 | 2/2011 | Lee et al. | |
| 2008/0316851 A1* | 12/2008 | Kinoshita | G11C 8/16 365/230.05 |
| 2011/0188328 A1* | 8/2011 | Yang | G11C 11/412 365/189.16 |
| 2015/0248928 A1* | 9/2015 | Wu | G11C 11/419 365/154 |

OTHER PUBLICATIONS

K. Nii, et al., "A 65nm ultra-high-density dual port SRAM with 0.71um2 8T cell for SoC", Sypm. VLSI Circuits, 2006.
Y. Ishii et al., "A 28nm dual-port SRAM macro with active bitline equalizing circuitry against write disturb issue", Symp. VLSI Circuits, 2010, pp. 99-100.
Taiwan Intellectual Property Office (TIPO), Office Action issued Mar. 2, 2016.

* cited by examiner

*Primary Examiner* — Son Dinh
*Assistant Examiner* — Uyen B Tran
(74) *Attorney, Agent, or Firm* — Winston Hsu; Scott Margo

(57) ABSTRACT

A circuit for mitigating write disturbance including a first and a second discharge control paths is provided and applied to the dual-port SRAM. The first discharge control path is connected to bit lines of the second port and the first port, and a first control line. The second discharge control path is connected to inverse bit lines of the second port and the first port, and the first control line. A first discharge current is generated when the bit line of the second and the first ports are respectively at a high level voltage, and a low level voltage, and the first control line operates. A second discharge current is generated when the inverse bit line of the second and the first ports are respectively at the high level voltage and the low level voltage, and the first control line operates.

8 Claims, 12 Drawing Sheets

CIRCUIT FOR MITIGATING WRITE DISTURBANCE OF DUAL-PORT SRAM

This application claims the benefit of Taiwan Application Serial No. 103125289, filed Jul. 24, 2014, the subject matter of which is incorporated herein by reference.

FIELD OF THE INVENTION

The present invention relates to a circuit applied to a static random access memory (SRAM), and more particularly to a circuit for mitigating write disturbance of a dual-port SRAM.

BACKGROUND OF THE INVENTION

FIG. 1 is a schematic diagram illustrating a memory cell of a dual-port SRAM. The memory cell 100 includes a latching circuit 110, and four pass gates APG1, APG2, BPG1, BPG2.

In the latching circuit 110, the output terminal of an inverter 104 is connected to the input terminal of an inverter 102, and the input terminal of the inverter 104 is connected to the output terminal of the inverter 102. Furthermore, the output terminal of the inverter 104 is used as the output terminal O of the latching circuit 110, and the output terminal of the inverter 102 is used as the inverse output terminal OB of the latching circuit 110.

Furthermore, each memory cell 100 has two ports (hereinafter, port A and port B). In the port A, the ON and OFF statuses of both the first pass gate AGP1, and the second pass gate APG2 of the port A are controlled by the word line AWL of the port A. Accordingly, the write data can be stored in the memory cell through the bit line ABL, and the inverse bit line ABLB of the port A. Alternatively, the data stored in the memory cell 100 can be read through the bit line ABL, and the inverse bit line ABLB of the port A.

Similarly, the ON and OFF statuses of both the first pass gate BGP1 and the second pass gate BPG2 of the port B are controlled by the word line BWL of the port B. Accordingly, the write data can be stored in the memory cell through the bit line BBL, and the inverse bit line BBLB of the port B. Alternatively, the data stored in the memory cell 100 can be read through the bit line BBL, and the inverse bit line BBLB of the port B.

Furthermore, the first pass gate APG1 of the port A is connected between the bit line ABL of the port A, and the output terminal O of the latching circuit 110. In addition, the control terminal of the first pass gate APG1 of the port A is connected to the word line AWL of the port A. The second pass gate APG2 of the port A is connected between the inverse bit line ABLB of the port A, and the inverse output terminal OB of the latching circuit 110. In addition, the control terminal of the second pass gate APG2 of the port A is connected to the word line AWL of the port A.

The first pass gate BPG1 of the port B is connected between the bit line BBL of the port B, and the output terminal O of the latching circuit 110, and the control terminal of the first pass gate BPG1 of the port B is connected to the word line BWL of the port B. The second pass gate BPG2 of the port B is connected between the inverse bit line BBLB of the port B, and the inverse output terminal OB of the latching circuit 110, and the control terminal of the second pass gate BPG2 of the port B is connected to the word line BWL of the port B.

Basically, the word line AWL, the bit line ABL, and the inverse bit line ABLB of the port A may be considered as port A signals of the memory cell 100. The word line BWL, the bit line BBL, and the inverse bit line BBLB of the port B may be considered as port B signals of the memory cell 100. In addition, a control circuit (not shown) connected to the memory cell 100 may proceed a read operation or a write operation to the memory cell 100 through the port A signals or the port B signals of the memory cell 100. Related operations of the memory cell of the dual-port SRAM are briefly illustrated below.

FIGS. 2A and 2B are schematic diagrams illustrating the port A signals are utilized in the read operation to the memory cell. The output terminal O of the latching circuit 110 is with a high level voltage (Vcc), and the inverse output terminal OB of the latching circuit OB is with a low level voltage (0V).

As shown in FIG. 2A, the control circuit (not shown) pre-charges the bit line ABL, and the inverse bit line ABLB of the port A to the high level voltage (Vcc) before the word line AWL of the port A operates. That is, the word line AWL of the port A is 0V. Then, the bit line ABL and the inverse bit line ABLB of the port A are left floating.

As shown in 2B, when the word line AWL of the port A operates (voltage of the word line AWL of the port A is Vcc), the first pass gate (APG1), and the second pass gate (APG2) of the port A are turned on. Since the output terminal O of the latching circuit 110 is at the high level voltage (Vcc), the bit line ABL of the port A remains at the high level voltage (Vcc). Furthermore, since the inverse output terminal OB is at the low level voltage (0V), a discharge current Id flowing from the inverse bit ABLB line of the port A to the inverse output OB of the latching circuit 110 is generated. Thus, the inverse bit line ABLB of the port A changes to the low level voltage (0V). Therefore, the data stored in the memory cell 100 can be retrieved through the voltages of the bit line ABL, and the inverse bit line ABLB of the port A. Then, the read operation is complete.

Similar to the operations shown in FIGS. 2A and 2B, the memory cell can be read through the port B signals.

Furthermore, the memory cell 100 of dual-port SRAM mentioned above features that both the port A signals and the port B signals can be simultaneously utilized in the read operation. In other words, the control circuit (not shown) can freely utilize either port A signals, port B signals, or both port A signals and port B signals to proceed the read operation.

FIGS. 3A and 3B are schematic diagrams illustrating the write operation of the memory cell through the port A signals. The output terminal O of the latching circuit is high level (Vcc) and the inverse output terminal OB of the latching circuit 110 is low level (0V). Furthermore, the control circuit (not shown) will store the low level (0V) in the memory cell 100.

As shown in FIG. 3A, the word line AWL of the port A is 0V before operates, and the control circuit (not shown) provides the low level (0V) to the bit line ABL of the port A, and the high level (Vcc) to the inverse bit line ABLB of the port A.

As shown in 3B, when the word line AWL of the port A operates (voltage of the word line AWL of the port A is Vcc), the first pass gate (APG1) and the second pass gate (APG2) of the port A are turned on. Since the bit line ABL of the port A is 0V, a discharge current Id flowing from the output terminal O of the latching circuit 110 to the bit line ABL of the port A is generated. Consequentially, the output terminal O of the latching circuit 110 changes to the low level voltage (0V). Meanwhile, as the inverse bit line ABLB of the port A is at the high level voltage (Vcc), a charging current Ic flowing from the inverse bit ABLB line of the port A to the inverse output OB of the latching circuit 110 is generated. Thus, the inverse output OB will change to the high level voltage (Vcc), and the write operation is complete.

Similar to the operations illustrated in FIGS. 3A and 3B, the port B signals of the memory cell can be utilized for write operation.

Another feature of the above memory cell 100 of the dual-port SRAM is to utilize port signals of a single port to execute the read operation to the memory cell 100, and utilize port signals of another port to execute the write operation. However, while executing the above read operation, and the write operation, write disturbance may occur and result in write failure. In consequence, data cannot be correctly written to the memory cell 100. Details are illustrated below.

FIGS. 4A to 4C are schematic diagrams illustrating port A signals are utilized to execute the write operation to the memory cell, and the port B signals are utilized to execute the read operation to the memory cell. The voltage of the output terminal O of the latching circuit 110 is high level (Vcc), and the voltage of the inverse output terminal OB of the latching circuit 110 is low level (0V). Furthermore, the control circuit (not shown) will store the low level (0V) to the memory cell 100.

As shown in FIG. 4A, before the word line AWL of the port A, and the word line BWL of the port B operate, the control circuit (not shown) provides the low level (0 V) to the bit line ABL of the port A, and the high level (Vcc) to the inverse bit line ABLB of the port A. In addition, the control circuit (not shown) pre-charges both the bit line BBL and the inverse bit line of the port B to the high level voltage (Vcc) before left them floating.

As shown in FIG. 4B, when both the word line AWL of the port A, and the word line BWL of the port B operate, the first and the second pass gates APG1, APG2 of the port A, and the first and the second pass gates BPG1, BPG2 of the port B are all turned on. Since the bit line BBL of the port B is high level (Vcc), and the bit line ABL of the port A is low level (0V), a discharge current Id is generated from the bit line BBL of the port B. The discharge current Id flowing from the output terminal O of the latching circuit 110 to the bit line ABL of the port A is generated, and the write disturbance is accordingly caused.

Furthermore, the phenomenon that the voltage of the output terminal O of the latching circuit 110 cannot change to the low level (0V) due to the write disturbance is defined as the write failure.

As shown in FIG. 4C, the word line AWL of the port A, and the word line BWL of the port B operate between time point t1, and time point t2. Between the time point t1 and the time point t2, write disturbance (duration I) is generated because the discharge current Id flows from the bit line BBL of the port B to the bit line ABL of the port A, through the output terminal O of the latching circuit 110. Thus, at the time point t2, the output terminal O of the latching circuit 110 cannot change to the low level (0V) but maintains as the high level (Vcc). In consequence, the write failure occurs (duration II).

According to the above illustrations, the port A, and the port B are respectively utilized for the write operation, and the read operation. In a case that the voltage of the bit line ABL of the port A, and the bit line BBL of the port B port are different, and both the word line AWL of the port A, and the word line BWL of the port B operate at the same time, a discharge current between the two bit lines ABL, BBL will be generated, and the write disturbance occurs.

Similarly, if the voltages of the inverse bit line ABLB of the port A, and the inverse bit line BBLB of the port B are different, and both the word line AWL of the port A and the word line BWL of the port B operate at the same time, a discharge current between the two inverse bit lines ABLB, BBLB will be generated, and the write disturbance occurs.

FIG. 5 is a schematic diagram illustrating a curve of write disturbance of a conventional dual-port SRAM. In FIG. 5, Tsk represents a timing skew between the two word lines AWL, BWL, and Vcc represents a high level voltage. Basically, the timing skew between two word lines AWL, BWL is a factor of affecting the write disturbance, and Vcc is another factor.

For example, when the port A signals are utilized for the write operation, and the port B signals are utilized for the read operation, the timing difference between operation of the word line AWL of the port A, and operation of the word line BWL of the port B is defined as Tsk. That is, when the word line AWL of the port A, and the word line BWL of the port B operate simultaneously, Tsk is equal to 0. When operation of the word line AWL of the port A is prior to operation of the word line BWL of the port B, Tsk is greater than 0. When the word line AWL of the port A operates later than the word line BWL of the port B, Tsk is less than 0.

As shown in FIG. 5, when the word line AWL of the port A, and the word line BWL of the B port operate at the same time (Tsk=0), the high level voltage (Vcc) must be at least greater than 700 mV. Otherwise, the write disturbance will cause the wire failure.

When operation of the word line BWL of the port B prior to operation of the word line AWL of the port A, and the Tsk is greater than 0.10 ns s(Tsk<−0.10 ns), the high level voltage (Vcc) is 600 mV, and the write disturbance barely occurs. Moreover, when operation of the word line BWL of the port B is prior to operation of the word line AWL of the port A, and the Tsk is less than 0.10 ns s(−0.10 ns<Tsk<0), the high level voltage (Vcc) must be greater than 600 mV. Otherwise, the write disturbance will result in the write failure.

When operation of the word line AWL of the port A is prior to operation of the word line BWL of the port B, and the Tsk is greater than 1 ns(Tsk>1 ns), the high level voltage (Vcc) is 600 mV and the write disturbance barely occurs. Moreover, when operation of the word line AWL of the port A is prior to operation of the word line BWL of the port B, and the Tsk is less than 1 ns (0<Tsk<1 ns), the high level voltage (Vcc) must be greater than 600 mV. Otherwise, the write disturbance will result in the write failure. Especially when Tsk is 0.25 ns, the write disturbance affects severely, and the high level voltage (Vcc) must be greater than 900 mV to prevent the write failure.

SUMMARY OF THE INVENTION

An object of the present invention is to provide a circuit for mitigating the write disturbance applied to the dual-port SRAM, and to reduce the occurrence probabilities of the write failure.

An embodiment of the present invention provides a dual-port static random access memory (SRAM). The dual-port SRAM includes a memory cell, and a circuit for mitigating the write disturbance. The memory cell includes a word line of a first port, a bit line of the first port, an inverse bit line of the first port, a word line of a second port, a bit line of the second port, an inverse bit line of the second port, and a latching circuit. An output terminal of the latching circuit is coupled to the bit line of the first port, and the bit line of the second port, and an inverse output terminal of the latching circuit is coupled to the inverse bit line of the first port, and the inverse bit line of the second port. The circuit for mitigating the write disturbance includes a first discharge control path, and a second discharge control path. The first discharge control path is connected to the bit line of the second port, the bit line of the first port, and a first control line. A first discharge current flows from the bit line of the second port to a low level voltage when the bit line of the second port is at a high level voltage, the bit line of the first port is at the low level voltage, and the first control line operates. The second discharge control path is connected to the inverse bit line of the second port, the inverse bit line of the first port, and the first control line. The second discharge current flows from the inverse bit line of the second port to the low level voltage when the inverse bit line of the second port is at the high level voltage, the inverse bit line of the first port is at the low level voltage, and the first control line operates.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Since one of the two ports of the dual-port SRAM may be used for the write operation and the other port may be used for the read operation, the write operation is consequentially disturbed, and the write failure may occur. Therefore, a circuit for mitigating the write disturbance is provided in the present invention so that the write disturbance can be mitigated, and occurrence possibilities of the write failure are efficiently reduced.

Figure 1:
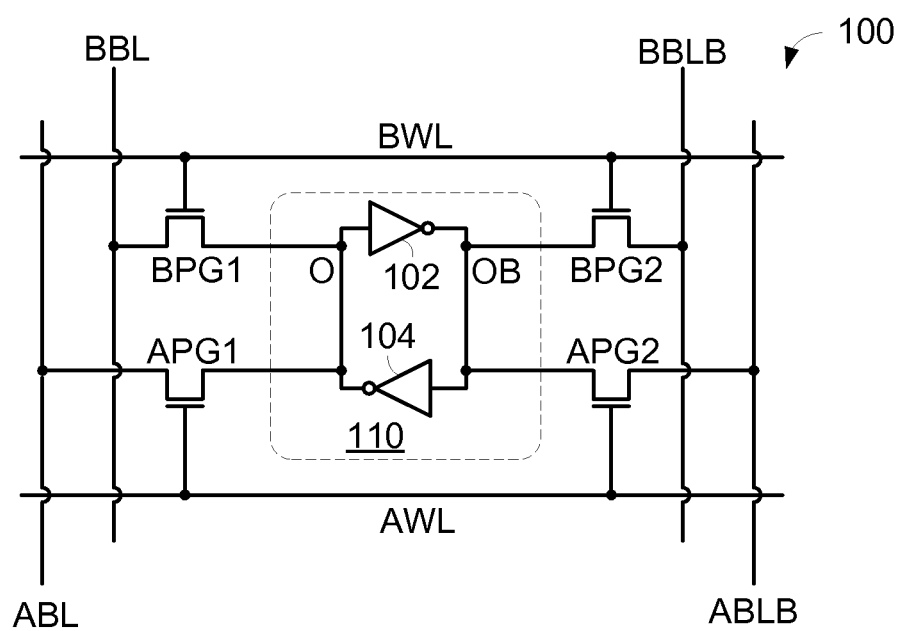
FIG. 1 (prior art) is a schematic diagram illustrating a memory cell of a dual-port SRAM.
Figure 2A:
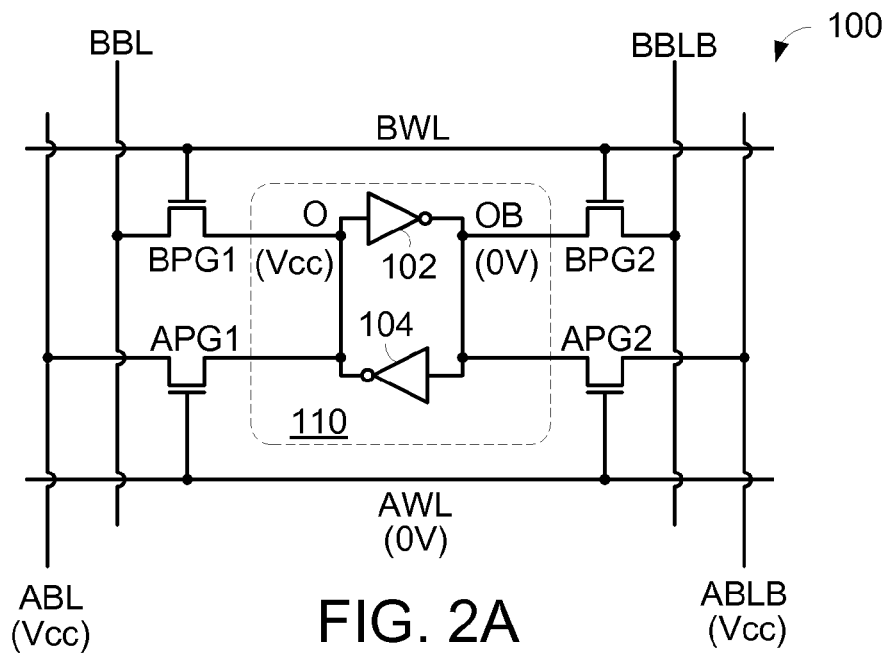
FIGS. 2A and 2B (prior art) are schematic diagrams illustrating the port A signals are utilized in the read operation to the memory cell.
Figure 2B:
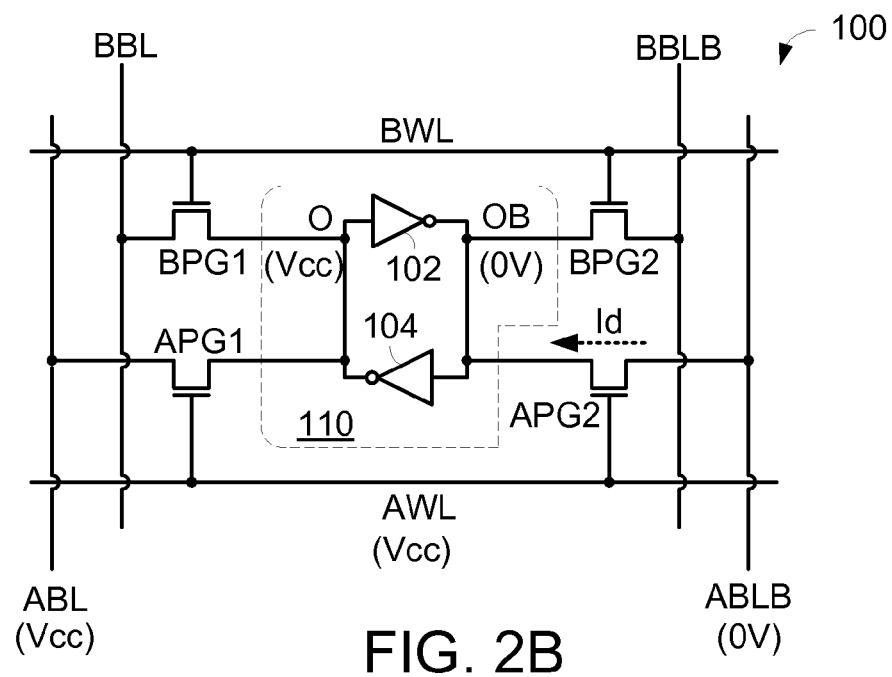
Figure 3A:
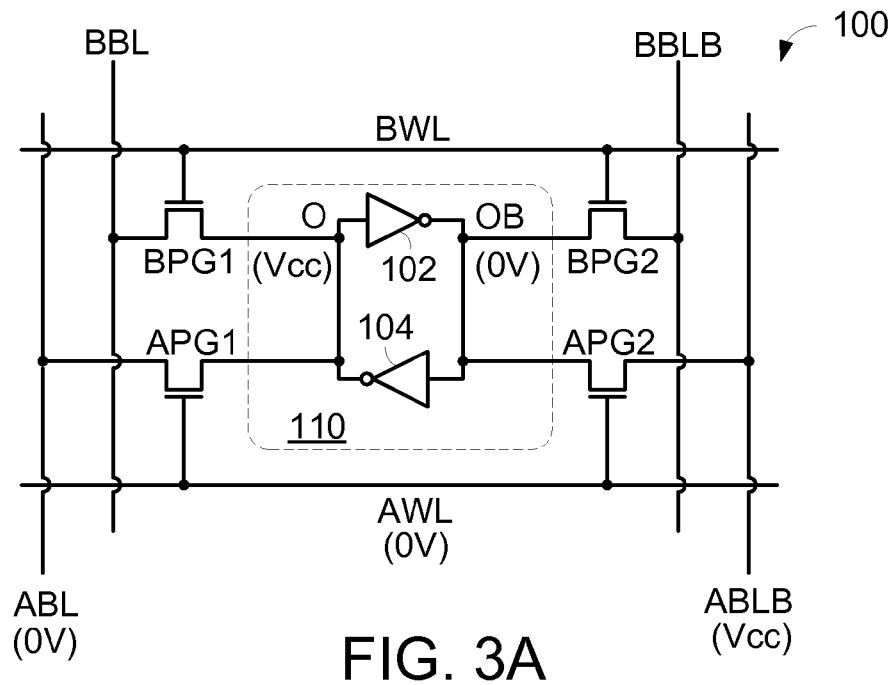
FIGS. 3A and 3B (prior art) are schematic diagrams illustrating the write operation of the memory cell through the port A signals.
Figure 3B:
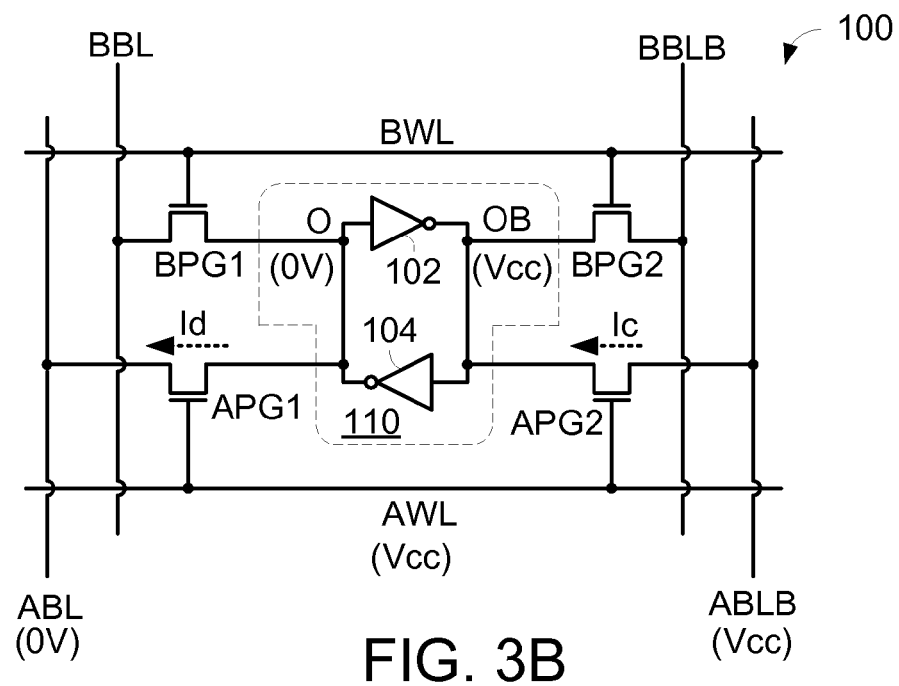
Figure 4A:
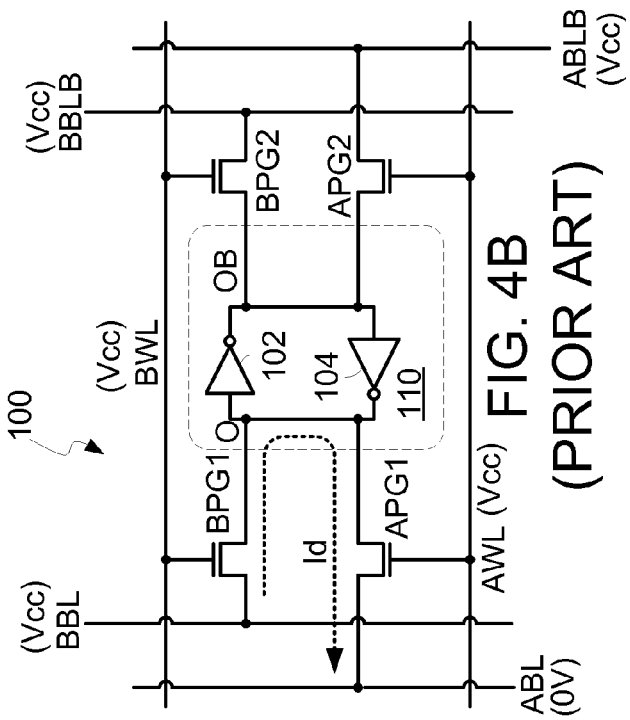
FIGS. 4A to 4C (prior art) are schematic diagrams illustrating port A signals are utilized to execute the write operation to the memory cell, and the port B signals are utilized to execute the read operation to the memory cell.
Figure 4B:
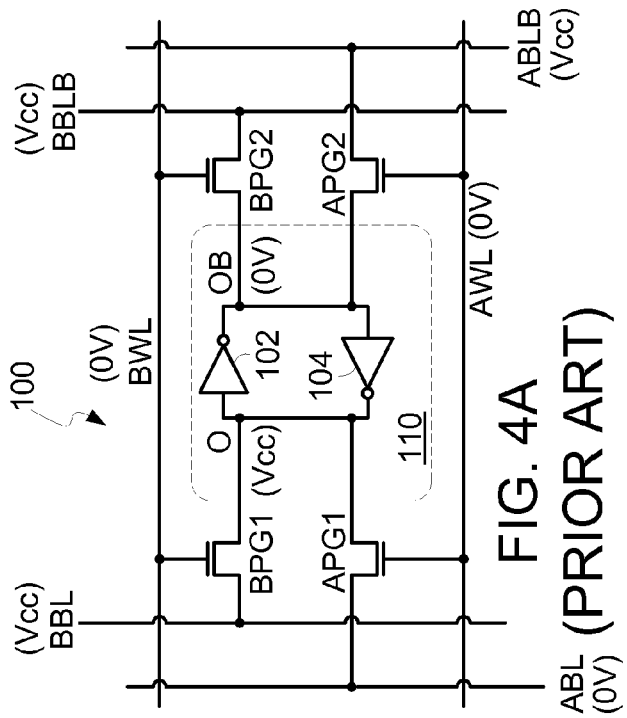
Figure 4C:
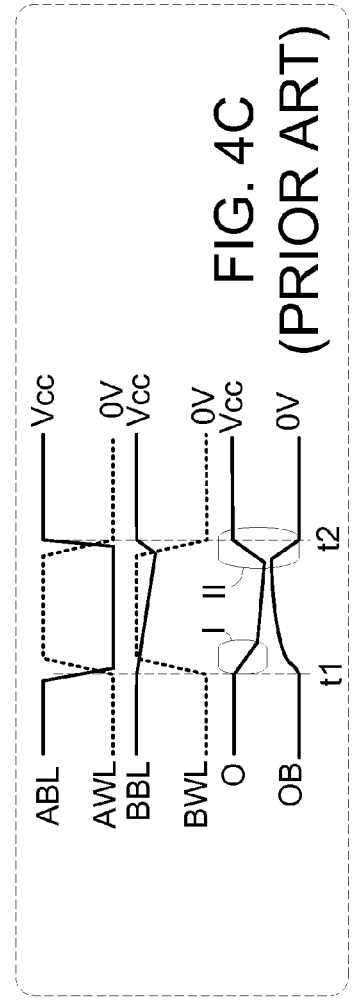
Figure 6A:
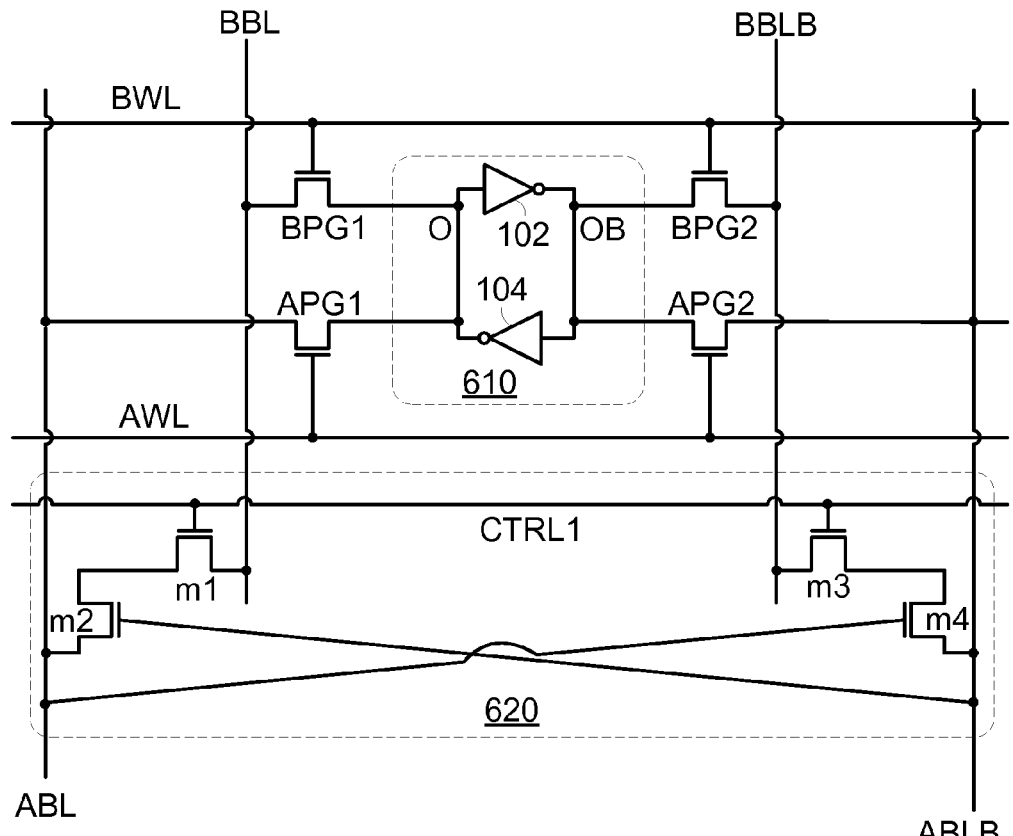
FIG. 6A is a schematic diagram illustrating a circuit for mitigating the write disturbance applied to the dual-port SRAM according to the first embodiment of the present invention.

FIG. 6A is a schematic diagram illustrating a circuit for mitigating the write disturbance applied to the dual-port SRAM according to the first embodiment of the present invention. The memory cell of the dual-port SRAM includes a latching circuit 610, and four pass gates APG1, APG2, BPG1, BPG2. The connections between the latching circuit 610, and the four pass gates APG1, APG2, BPG1, BPG2 are similar to those in FIG. 1, and are not redundantly illustrated.

The circuit for mitigating the write disturbance 620 includes a first discharge control path, and a second discharge control path. The first discharge control path includes a first transistor m1, and a second transistor m2. A first terminal of the first transistor m1 is connected to the bit line BBL of the port B, and a control terminal of the first transistor m1 is connected to the control line CTRL1. A first terminal of the second transistor m2 is connected to a second terminal of the first transistor m1, a second terminal of the second transistor m2 is connected to the bit line ABL of the port A, and a control terminal of the second transistor m2 is connected to the inverse bit line ABLB of the port A.

Furthermore, the second discharge control path includes a third transistor m3, and a fourth transistor m4. A first terminal of the third transistor m3 is connected to the inverse bit line BBLB of the port B, and a control terminal of the third transistor m3 is connected to the control line CTRL1. A first terminal of the fourth transistor m4 is connected to a second terminal of the third transistor m3, a second terminal of the fourth transistor m4 is connected to the inverse bit line ABLB of the port A, and a control terminal of the fourth transistor m4 is connected to the bit line ABL of the port A.

According to a first embodiment of the present invention, the control line CTRL is a write enable control line or a row address control line of the port A. Furthermore, during the write operation, one of the two discharge control paths will be switched on, and a discharge current is accordingly generated in response to the operation of the control line CTRL1. Since the discharge current does not flow through the latching circuit 610, the write disturbance can be accordingly mitigated.

Figure 6B:
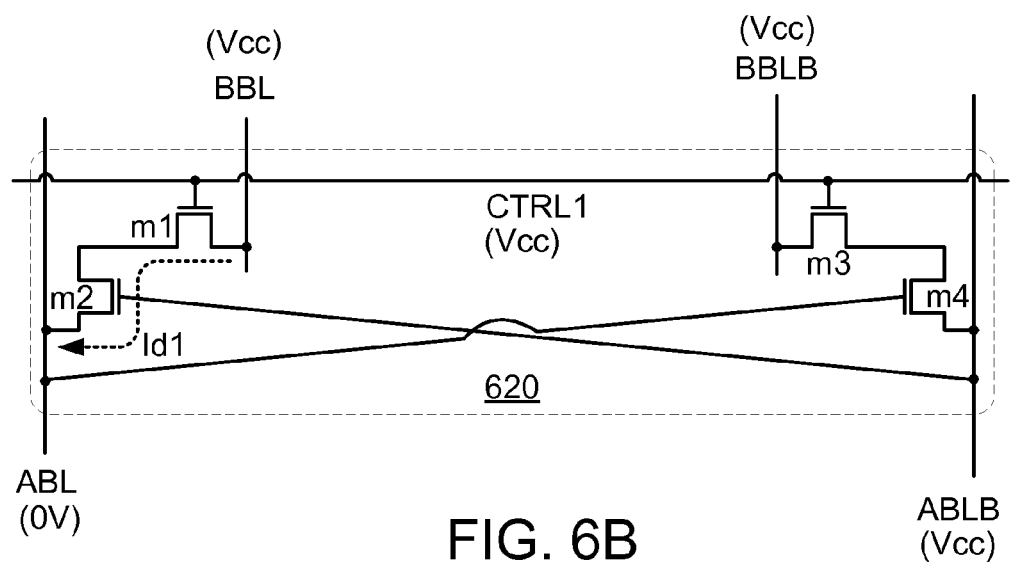
FIGS. 6B and 6C are schematic diagrams illustrating two conditions when the port A signals, and the port B signals of the dual-port SRAM are respectively utilized for the write operation, and the read operation.
Figure 6C:
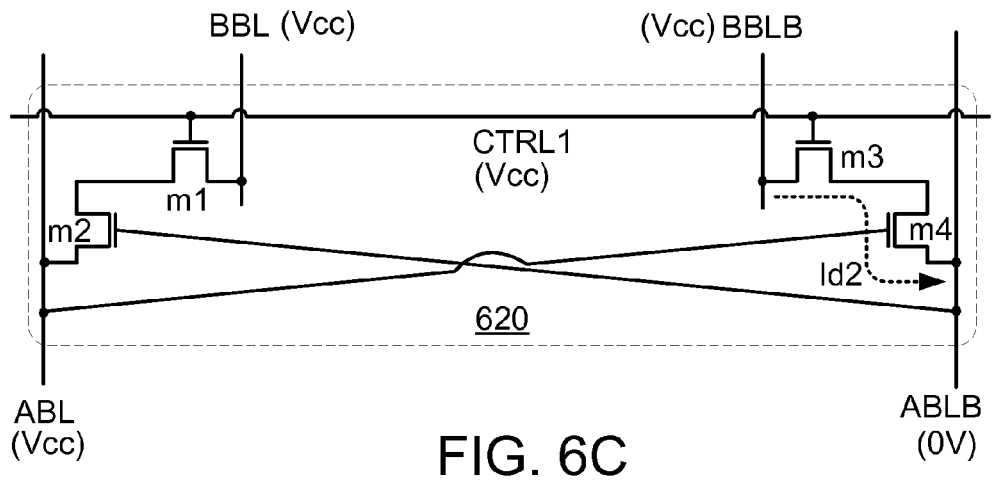

FIGS. 6B and 6C are schematic diagrams illustrating two conditions when the port A signals, and the port B signals of the dual-port SRAM are respectively utilized for the write operation, and the read operation. Furthermore, operations of the memory cell of the dual-port SRAM are not redundantly illustrated, but only operations of the circuit for mitigating the write disturbance 620 are illustrated.

As shown in FIG. 6B, in a case that the low level voltage (0V) is written to the memory cell through the port A signals, the low level voltage (0V), and the high level voltage (Vcc) are respectively provided to the bit line ABL, and the inverse bit line ABLB of the port A. In addition, the bit line BBL, and the inverse bit line BBLB of the port B are firstly pre-charged to the high level voltage (Vcc) before being left floating.

Therefore, when the control line CTRL1 operates (Vcc), the first discharge control path is turned on, and the second discharge control path is turned off, the discharge current Id1 flows from the bit line BBL of the port B to the bit line ABL of the port A through the transistors m1, m2. Thus, when the word line AWL of the port A, and the word line BWL of the port B operate, the discharge current is prevented from flowing through the output terminal O of the latching circuit 610, and the write disturbance is consequentially mitigated.

Similarly, as shown in FIG. 6C, in a case that the high level voltage (Vcc) is written to the memory cell through the port A signals, the high level voltage (Vcc), and the low level voltage (0V) are respectively provided to the bit line ABL, and the inverse bit line ABLB of the port A. In addition, the bit line BBL, and the inverse bit line BBLB of the port B are firstly pre-charged to the high level voltage (Vcc) before being left floating.

Therefore, when the control line CTRL1 operates (Vcc), the first discharge control path will be turned off, and the second discharge control path will be turned on. Therefore, the discharge current Id2 flows from the inverse bit line BBLB of the port B to the inverse bit line ABLB of the port A through the transistors m3, m4. Therefore, when the word line AWL of the port A, and the word line BWL of the port B operate, the discharge current is prevented from flowing through the inverse output terminal OB of the latching circuit 610, and the write disturbance is mitigated.

According to the above illustrations, the circuit for mitigating the write disturbance 620 according to the present invention is connected to the control line CTRL1, the bit line ABL, and the inverse bit line ABLB of the port A, and the bit line BBL, and the inverse bit line BBLB of the port B. The first discharge control path is turned on when the bit line ABL of the port A is at the low level voltage (0V), the bit line BBL of the port B is at the high level voltage (Vcc), and the control line CTRL1 operates. In consequence, the discharge current flowing from the high level voltage (Vcc) to the low level voltage (0V) is generated. Similarly, the second discharge control path is turned on when the inverse bit line ABLB of the port A is at the low level voltage (0V), the inverse bit line BBLB of the port B is at the high level voltage (Vcc), and the control line CTRL1 operates. In consequence, the discharge current flowing from the high level voltage (Vcc) to the low level voltage (0V) is generated.

Figure 7:
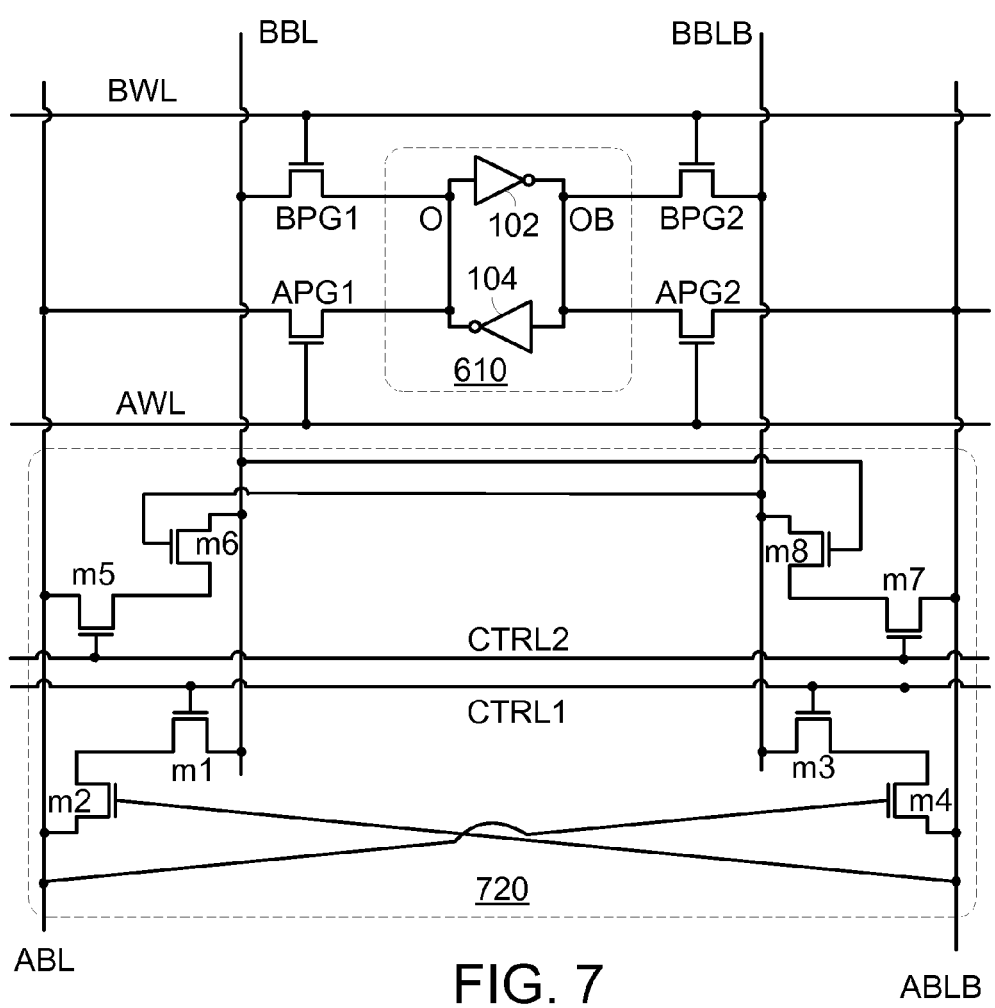
FIG. 7 is a schematic diagram illustrating a circuit for mitigating the write disturbance of the dual-port SRAM according to a second embodiment of the present invention.

FIG. 7 is a schematic diagram illustrating a circuit for mitigating the write disturbance of the dual-port SRAM according to a second embodiment of the present invention. The connections of the memory cell of the dual-port SRAM are not redundantly described.

Compared with the first embodiment, the circuit for mitigating the write disturbance 720 according to the second embodiment further includes a third, and a fourth discharge control paths. The third discharge control path includes a fifth transistor m5, and a sixth transistor m6. A first terminal of the fifth transistor m5 is connected to the bit line ABL of the port A, and a control terminal of the fifth transistor m5 is connected to the control line CTRL2. A first terminal of the sixth transistor m6 is connected to a second terminal of the transistor m5, a second terminal of the sixth transistor m6 is connected to bit line BBL of the port B, and a control terminal of the sixth transistor m6 is connected to the inverse bit line BBLB of the port B.

Furthermore, the fourth discharge control path includes a seventh transistor m7 and an eighth transistor m8. A first terminal of the seventh transistor m7 is connected to the inverse bit line ABLB of the port A, and a control terminal of the seventh transistor m7 is connected to the control line CTRL2. A first terminal of the eighth transistor m8 is connected to a second terminal of the seventh transistor m7, a second terminal of the eighth transistor m8 is connected to the inverse bit line BBLB of the port B, and a control terminal of the eighth transistor m8 is connected to the bit line BBL of the port B. According to the second embodiment of the present invention, the control line CTRL2 is a write enable control line or a row address control line of the port B.

With the circuit for mitigating the write disturbance 720 according to the second embodiment, the write disturbance can be mitigated in a case that the port A signals are used for the write operation and the port B signals are used for the read operation. Similarly, the write disturbance can be mitigated in a case that the port B signals are used for the write operation and the port A signals are used for the read operation. The detail operations are similar to those in the first embodiment and are not redundantly illustrated.

Figure 8A:
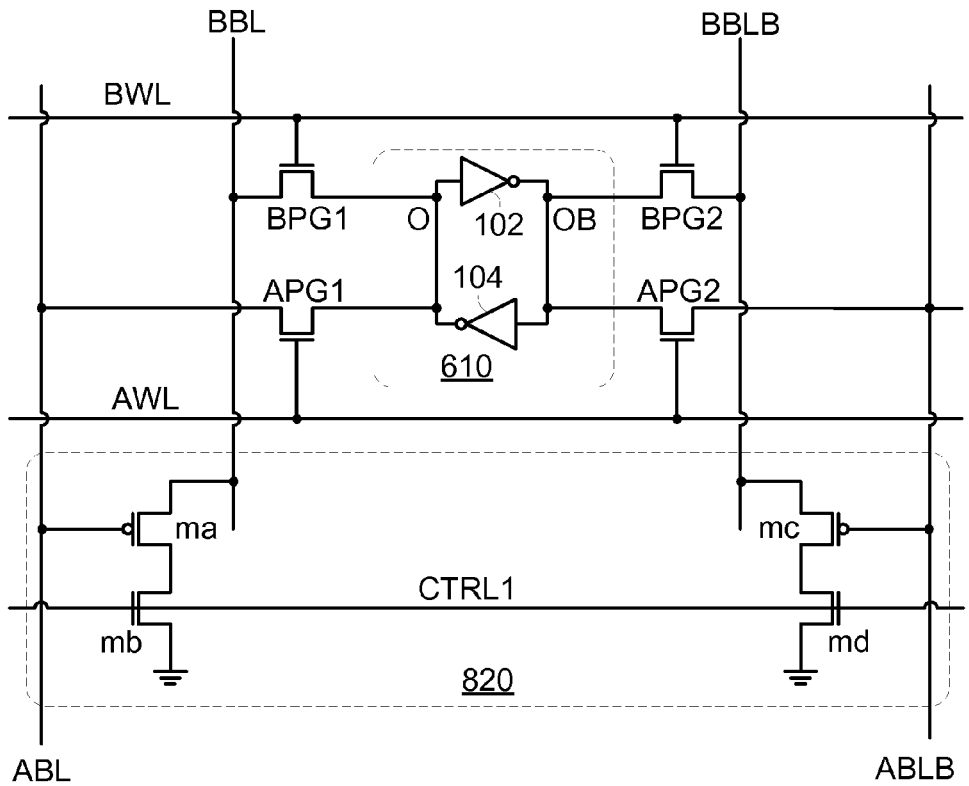
FIG. 8A is a schematic diagram illustrating a circuit for mitigating the write disturbance of the dual-port SRAM according to a third embodiment of the present invention.

FIG. 8A is a schematic diagram illustrating a circuit for mitigating the write disturbance of the dual-port SRAM according to a third embodiment of the present invention. The memory cell of the dual-port SRAM includes a latching circuit 610 and four pass gates APG1, APG2, BPG1, BPG2. The connections of the circuit for mitigating the write disturbance of the dual-port SRAM are not redundantly described.

The circuit for mitigating the write disturbance 620 includes a first discharge control path and a second discharge control path. The first discharge control path includes a transistor ma and a transistor mb. A first terminal of the transistor ma is connected to the bit line BBL of the port B, and a control terminal of the transistor ma is connected to the bit line ABL of the port A. A first terminal of the transistor mb is connected to a second terminal of the transistor ma, a second terminal of the transistor mb is connected to the ground terminal (0V), and a control terminal of the transistor mb is connected to the control line CTRL1.

Furthermore, the second discharge control path includes a transistor mc and a transistor md. A first terminal of the transistor mc is connected to the inverse bit line BBLB of the port B, and a control terminal of the transistor mc is connected to the inverse bit line ABLB of the port A. A first terminal of the transistor md is connected to a second terminal of the transistor mc, a second terminal of the transistor md is connected to the ground terminal (0V), and a control terminal of the transistor and is connected to the control line CTRL1.

According to the third embodiment of the present invention, the control line CTRL is the write enable control line or the row address control line of the port A. Furthermore, during the write operation, one of the two discharge control path will be turned on according to operation of the control line CTRL1 and the discharge current is consequentially generated. Since the discharge current does not flow through the latching circuit 610, the write disturbance is mitigated.

Figure 8B:
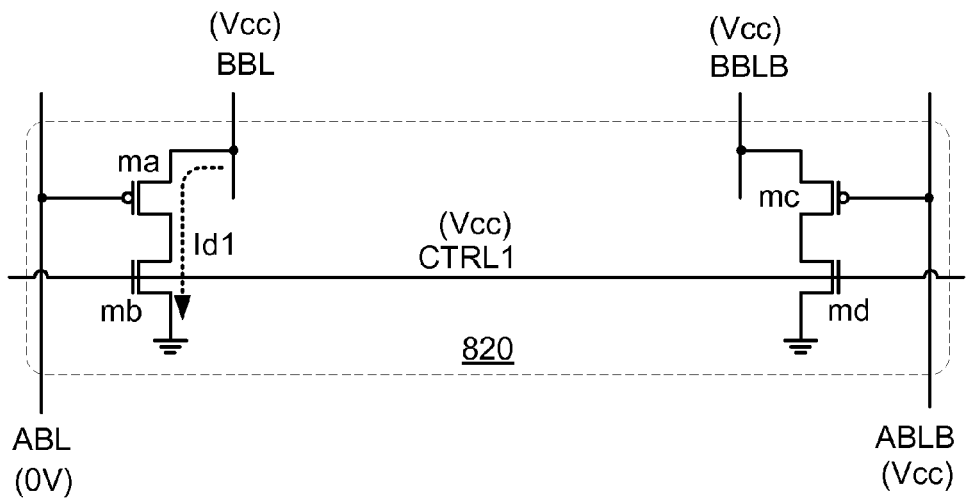
FIGS. 8B and 8C are schematic diagrams illustrating two conditions that the port A signals and the port B signals are respectively utilized for the write operation and the read operation of the dual-port SRAM.
Figure 8C:
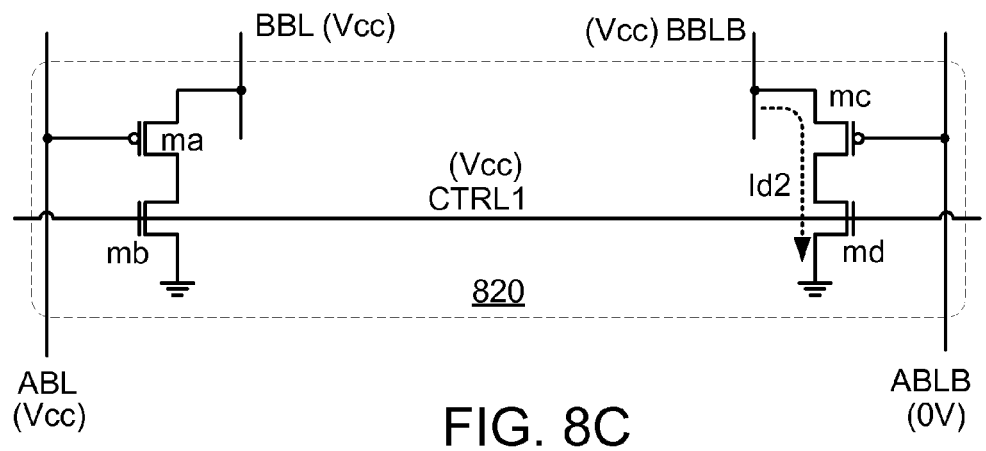

FIGS. 8B and 8C are schematic diagrams illustrating two conditions that the port A signals, and the port B signals are respectively utilized for the write operation, and the read operation of the dual-port SRAM. Only the operations of the circuit for mitigating the write disturbance 820 are illustrated, and the operations of the dual-port SRAM are not redundantly illustrated.

As show in FIG. 8B, in a case that the low level voltage (0V) is provided to the memory cell through the port A signals, the low level voltage (0V) and the high level voltage (Vcc) are respectively provided to the bit line ABL and the inverse bit line ABLB of the port A. In addition, the bit line BBL, and the inverse bit line BBLB of the port B are pre-charged to the high level voltage (Vcc) before being left floating.

Thus, when the control line CTRL1 operates (Vcc), the first discharge control path is turned on, and the second discharge control path is turned off. The discharge current Id1 flows from the bit line BBL of the B port to the ground terminal (0V) through the transistor ma and the transistor mb. Therefore, when word line AWL of the port A, and the word line BWL of the port B operate, the discharge current is prevented from flowing through the output terminal O of the latching circuit 610 and the write disturbance is accordingly mitigated.

Similarly, as shown in FIG. 8C, while the port A signals are utilized to write the high level voltage (Vcc) to the memory cell, the high level voltage (Vcc) is provided to the bit line ABL of the port A, and the low level voltage (0V) is provided to the inverse bit line ABLB of the port A. In addition, after the bit line BBL of the port B and the inverse bit line BBLB of the port B are pre-charged to Vcc, the bit line BBL and the inverse bit line BBLB of the port B are connected as floating.

Therefore, when the control line CTRL1 operates (with the high level voltage Vcc), the first discharge control path will be turned off, and the second discharge control path will be turned on. The discharge current Id2 flows from the inverse bit line BBLB of the port B to the ground terminal (0V) through the transistors mc, md. Therefore, when the word line AWL of the port A and the word line BWL of the port B operate, the discharge current will be prevented from flowing through the inverse output terminal OB of the latching circuit 610. Thus, the write disturbance is accordingly mitigated.

Based on the above illustrations, the circuit for mitigating the write disturbance 820 is connected to the control line CTRL1, the bit line ABL, and the inverse bit line ABLB of the port A, and the bit line BBL, and the inverse bit line BBLB of the port B. In a case that the bit line ABL of the port A is at the low level voltage (0V), the bit line BBL of the port B is at the high level (Vcc), and the control line CTRL1 operates, the first discharge control path is turned on, and the discharge current flowing from the high level voltage (Vcc) to the low level voltage (0V) is accordingly generated. Similarly, in another cast that the inverse bit line ABLB of the port A is at low level voltage (0V), the inverse bit lint BBLB of the port B is at the high level voltage (Vcc), and the control line CTRL1 operates, the second discharge control path is turned on, and the discharge current flowing from the high level voltage (Vcc) to the low level voltage (0V) is accordingly generated.

Figure 9:
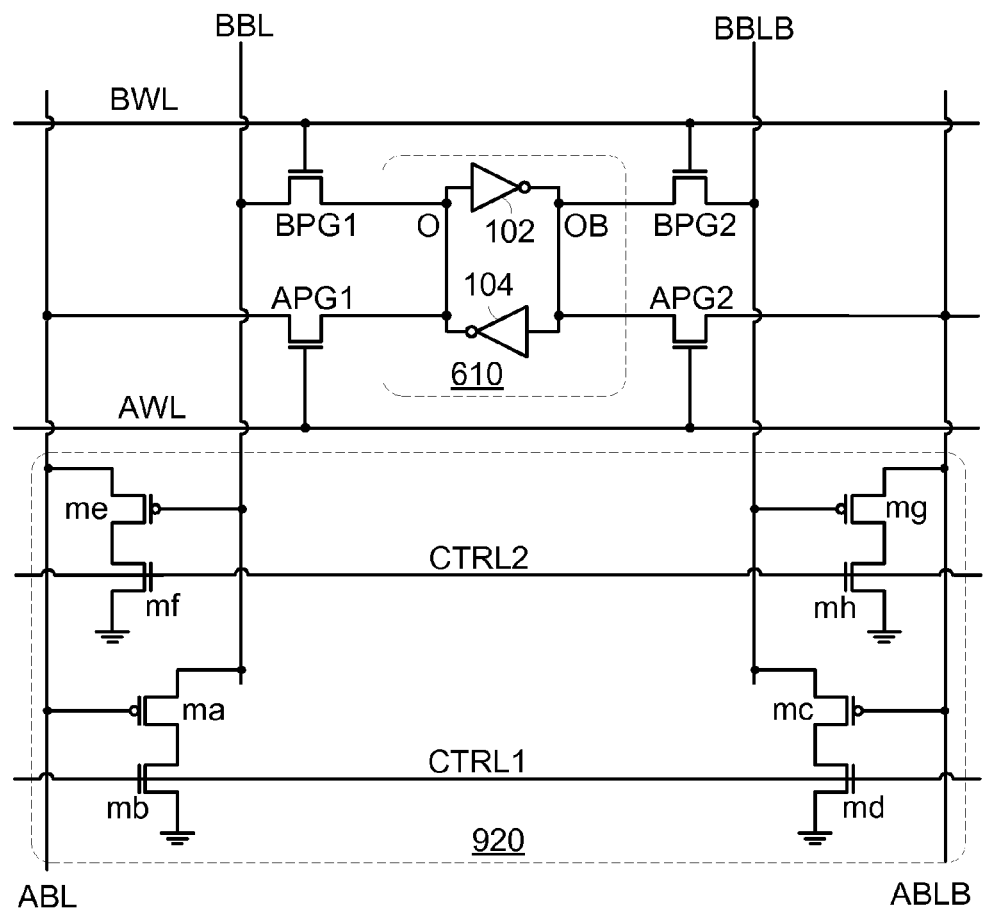
FIG. 9 is a schematic diagram illustrating the circuit for mitigating the write disturbance of the dual-port SRAM according to the fourth embodiment of the present invention.

FIG. 9 is a schematic diagram illustrating the circuit for mitigating the write disturbance of the dual-port SRAM according to the fourth embodiment of the present invention. The connections of the memory cell of the dual-port SRAM are not redundantly illustrated.

Compared with the third embodiment, the circuit for mitigating the write disturbance 920 according to the fourth embodiment further includes a third discharge control path, and a fourth discharge control path. The third discharge control path includes transistors me, mf. A first terminal of the transistor me is connected to the bit line ABL of the port A, and a control terminal of the transistor me is connected to the bit line BBL of the port B. A first terminal of the transistor mf is connected to a second terminal of the transistor me, a second terminal of the transistor mf is connected to the ground terminal with 0V, and a control terminal of the transistor mf is connected to the control line CTRL2.

Furthermore, the fourth discharge control path includes transistors mg, mh. A first terminal of the transistor mg is connected to the inverse bit line ABLB of the port A, and a control terminal of the transistor mg is connected to the inverse bit line BBLB of the port B. A first terminal of the transistor mh is connected to a second terminal of the transistor mg, a second terminal of the transistor mh is connected to the ground terminal (0V), and a control terminal of the transistor mh is connected to the control line CTRL2. According to the fourth embodiment of the present invention, the control line CTRL2 is the write enable control line or the row address control line of the port B.

With the circuit for mitigating the write disturbance 920 according to the fourth embodiment, the write disturbance is mitigated when the port A signals and the port B signals are respectively utilized for the write operation and the read operation. Moreover, the write disturbance is mitigated as well when the port B signals, and the port A signals are respectively utilized for the write operation, and the read operation. Details of the operations of the fourth embodiment are analog to the third embodiment and not redundantly illustrated.

Figure 10A:
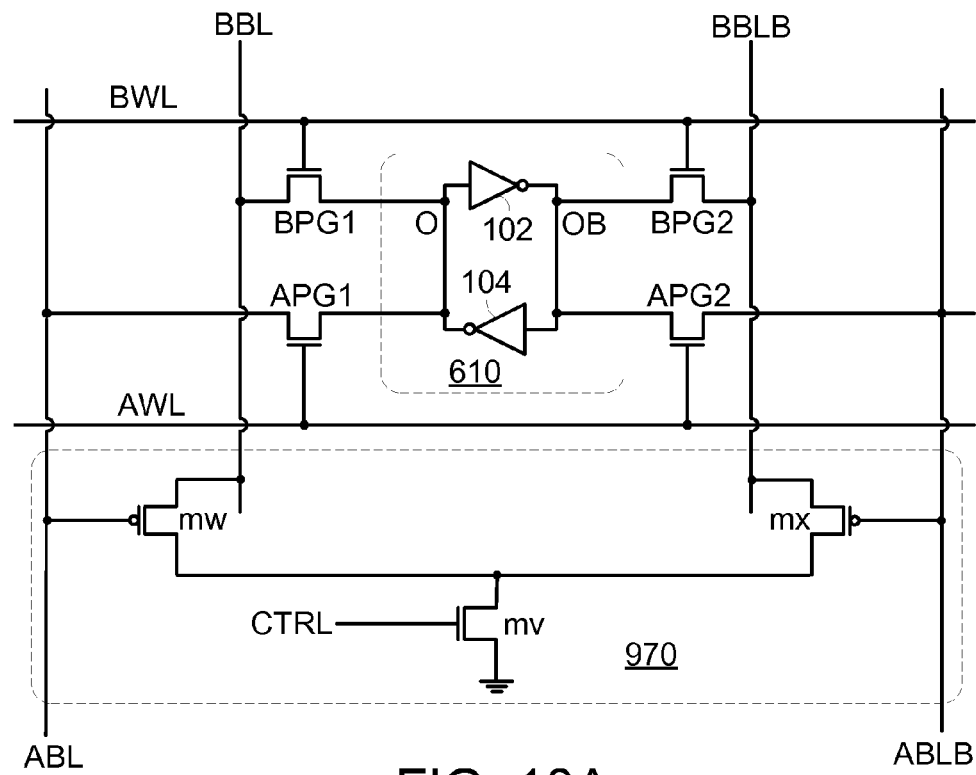
FIG. 10A is a schematic diagram illustrating the circuit for mitigating the write disturbance of the dual-port SRAM according to the fifth embodiment of the present invention.

FIG. 10A is a schematic diagram illustrating the circuit for mitigating the write disturbance of the dual-port SRAM according to the fifth embodiment of the present invention. The memory cell of the dual-port SRAM includes a latching circuit 610, and four pass gates APG1, APG2, BPG1, BPG2. The connections between the latching circuit 610, and the four pass gates APG1, APG2, BPG1, BPG2 are not redundantly described.

The circuit for mitigating the write disturbance 970 includes a first discharge control path, and a second discharge control path. The first discharge control path includes a transistor mw, with a first terminal connected to the bit line BBL of the port B, a second terminal connected to the first terminal of the transistor mv, and a control terminal connected to the bit line ABL of the port A. The second discharge control path includes a transistor mx, with a first terminal connected to the inverse bit line BBLB of the port B, a second terminal connected to the first terminal of the transistor mv, and a control terminal connected to the inverse bit line ABLB of the port A. Furthermore, the second terminal of the transistor my is connected to the ground terminal (0V), and the control terminal of the transistor my is connected to the control line CTRL.

According to the fifth embodiment of the present invention, the control line CTRL is the write enable control line or the row address control line of the port A. Furthermore, during the write operation, in response to the operation of the control line CTRL, one of the two discharge control paths is turned on, and the discharge current is accordingly generated. Since the discharge current does not flow through the latching circuit 610, the write disturbance is mitigated.

Figure 10B:
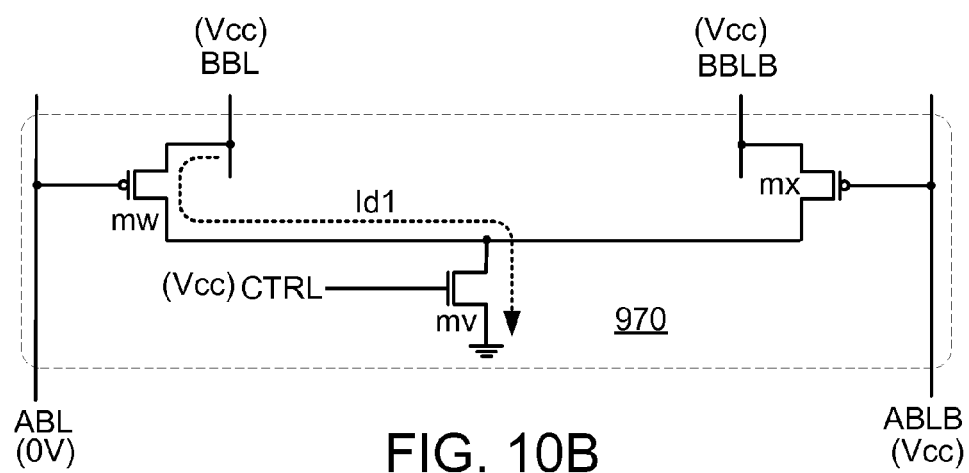
FIGS. 10B and 10C are schematic diagrams illustrating two situations that the port A signals and the port B signals are respectively utilized for the write operation, and the read operations of the dual-port SRAM.
Figure 10C:
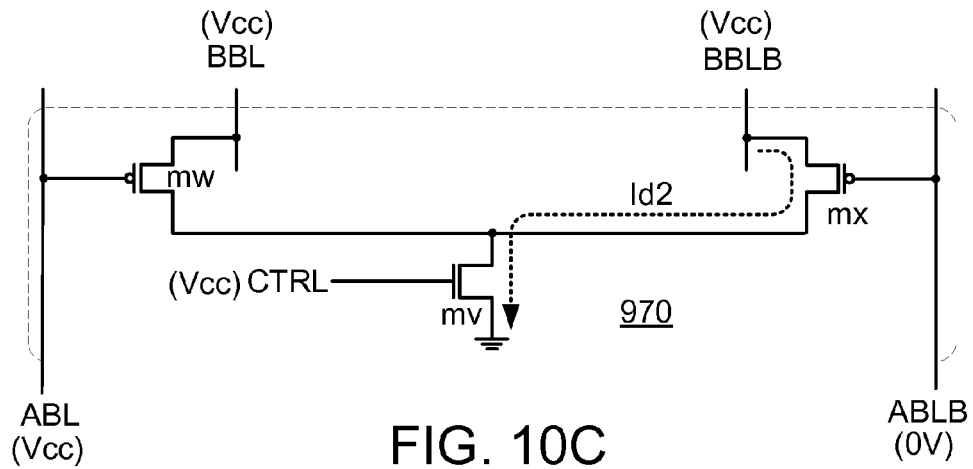

FIGS. 10B and 10O are schematic diagrams illustrating two situations that the port A signals and the port B signals are respectively utilized for the write operation, and the read operations of the dual-port SRAM. Furthermore, only the operations of the circuit for mitigating the write disturbance 970 are illustrated, and the operations of the memory cell of the dual-port SRAM are not redundantly illustrated.

As shown in FIG. 10B, in the case that writing the low level voltage (0V) to the memory cell through the port A signals, the low level voltage (0V) and is the high level voltage (Vcc) are respectively provided to the bit line ABL, and the inverse bit line ABLB of the port A. In addition, the bit line BBL, and the inverse bit line BBLB of the port B are pre-charged to the high level voltage (Vcc) before being left floating.

Therefore, when the control line CTRL operates (at the high level voltage Vcc), the first discharge control path, and the second discharge control path are turned off, and the discharge current Id1 flows from the bit line BBL of the port B to the ground terminal (0V) through the transistors mw, my. Therefore, when the word line AWL of the port A, and the word line BWL of the port B operate, the discharge current is prevented from flowing through the output terminal O of the latching circuit 610. Thus, the write disturbance is accordingly mitigated.

Similarly, as shown in FIG. 10O, in the case that the high level voltage (Vcc) is written to the memory cell through the port A signals, the high level voltage (Vcc) and the low level voltage (0V) are respectively provided to the bit line ABL, and the inverse bit line ABLB of the port A. In addition, the bit line BBL, and the inverse bit line BBLB of the port B are pre-charged to the high level voltage (Vcc) before being left floating.

Therefore, when the control line CTRL operates (at the high level voltage Vcc), the first discharge control path is turned off, and the second discharge control path is turned on. The discharge current Id2 flows from the inverse bit line BBLB of the port B to the ground terminal (0V) through the transistors mx, my. Therefore, when the word line AWL of the port A and the word line BWL of the B port operate, the discharge current is prevented from flowing through the inverse input terminal OB of the latching circuit 610. Thus, the write disturbance is accordingly mitigated.

According to the above illustrations, the circuit for mitigating the write disturbance 970 according to the present invention is connected to the control line CTRL, the bit line ABL, and the inverse bit line ABLB of the port A, and the bit line BBL, and the inverse bit line BBLB of the port B. In a case that the bit line ABL of the port A is at the low level voltage (0V), the bit line BBL of the port B is at the high level voltage (Vcc), and the control line CTRL operate, the first discharge path will be turned on, and the discharge current flowing from the high level voltage (Vcc) to the low level voltage (0V) is generated. Similarly, in another case that the inverse bit line ABLB of the port A is at the low level voltage (0V), the inverse bit line BBLB of the port B is at the high level voltage (Vcc), and the control line CTRL operates, the second discharge control path is turned on, and the discharge current flowing from the high level voltage (Vcc) to the low level voltage (0V) is accordingly generated.

Figure 11:
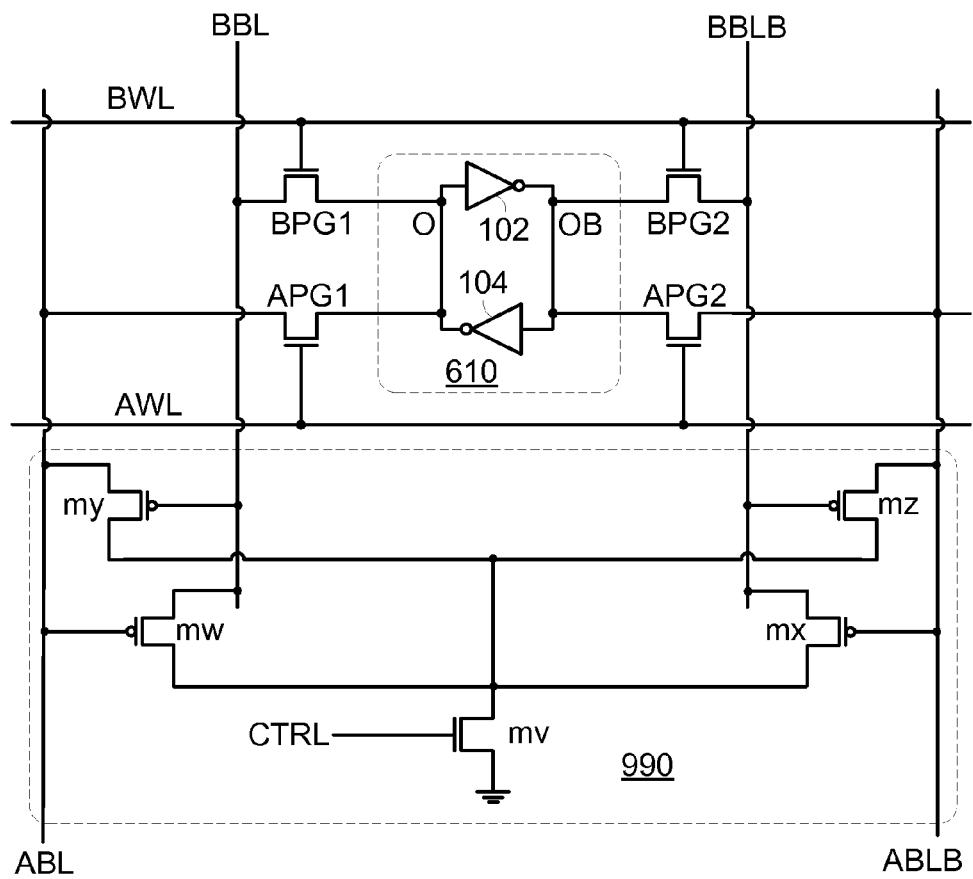
FIG. 11 is a schematic diagram illustrating the circuit for mitigating the write disturbance applied to the dual-port SRAM according to the sixth embodiment of the present invention.

FIG. 11 is a schematic diagram illustrating the circuit for mitigating the write disturbance applied to the dual-port SRAM according to the sixth embodiment of the present invention. The connections of the memory cell of the dual-port SRAM are not redundantly illustrated.

Compared with the fifth embodiment, the circuit for mitigating the write disturbance 990 according to the sixth embodiment further includes the third and the fourth discharge control paths. The third discharge control path includes the transistor my, with a first terminal connected to the bit line ABL of the port A, a second terminal connected to the first terminal of the transistor mv, and a control terminal connected to the bit line BBL of the port B. The fourth discharge control path includes the transistor mz, with a first terminal connected to the inverse bit line ABLB of the port A, a second terminal connected to the first terminal of the transistor mv, and a control terminal connected to the inverse bit line BBLB of the port B.

With the circuit for mitigating the write disturbance 990 according to the sixth embodiment, the write disturbance is mitigated if the port A signals and the port B signals are respectively utilized for the write operation, and the read operation. In addition, the write disturbance is mitigated if the port B signals, and the port A signals are respectively utilized for the write operation, and the read operation. The detail operations of the sixth embodiment are similar to the ones in the fifth embodiment, and are not redundantly illustrated.

Figure 5:
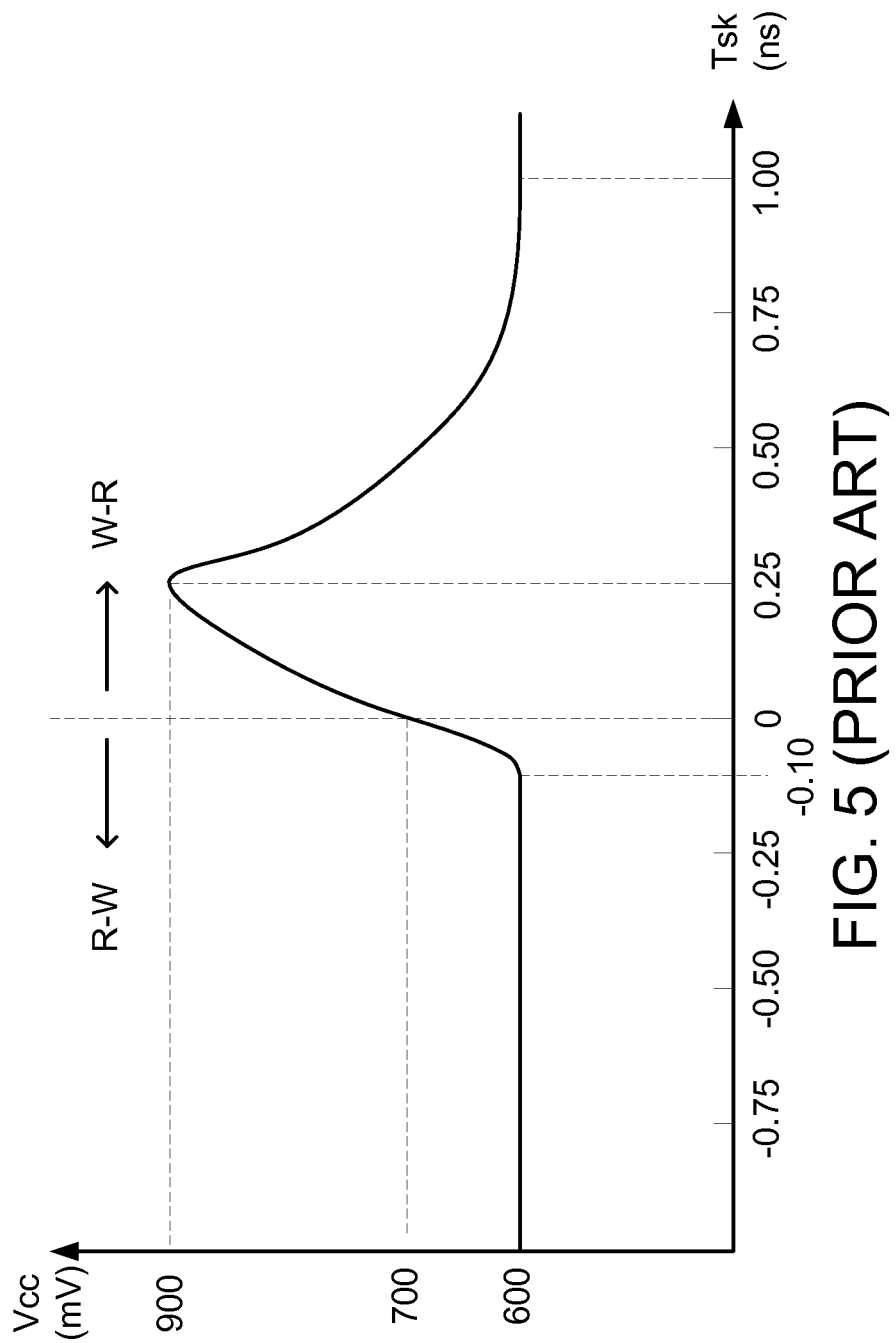
FIG. 5 (prior art) is a schematic diagram illustrating a curve of write disturbance of a conventional dual-port SRAM.
Figure 12:
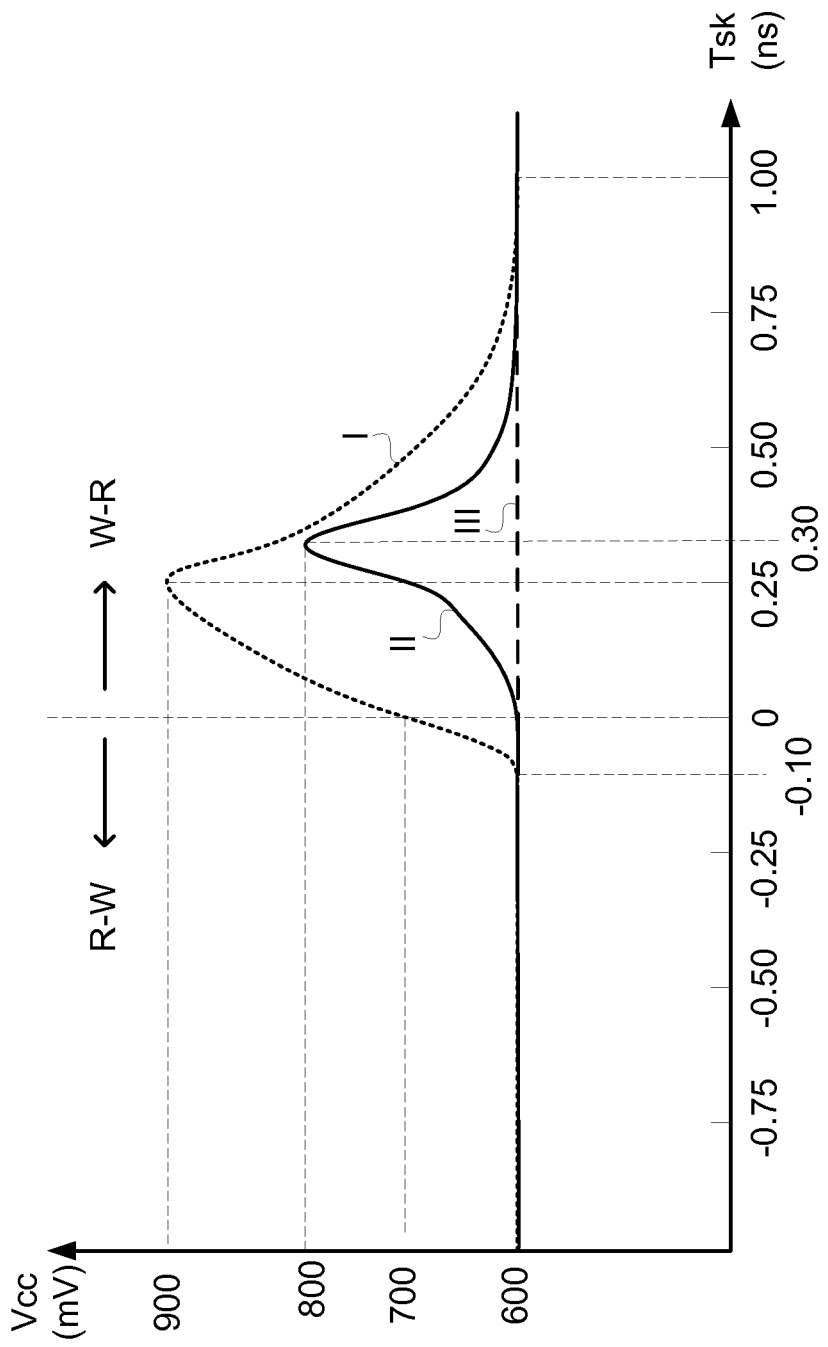
FIG. 12 is a schematic diagram illustrating the write disturbance waveform for the circuit for mitigating the write disturbance of the dual-port SRAM according to the present invention.

FIG. 12 is a schematic diagram illustrating the write disturbance waveform for the circuit for mitigating the write disturbance of the dual-port SRAM according to the present invention. The waveform I representing the write disturbance waveform corresponding to a case without the circuit for mitigating the write disturbance is similar to that in FIG. 5.

The waveform II is the write disturbance waveform representing the circuits for mitigating the write disturbance according to the third to the sixth embodiments of the present invention. In addition, the third waveform III is the write disturbance waveform representing the circuits for mitigating the write disturbance according to the first, and the second embodiments of the present invention. Obviously, the write disturbance of the dual-port SRAM according to the present invention can be mitigated, and the occurrence possibilities of the write failure are reduced when signals of either the port A or the port B are used for the write operation and signals of the other port are used for the read operation.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A dual-port static random access memory (SRAM), comprising:
   a memory cell comprising a word line of a first port, a bit line of the first port, an inverse bit line of the first port, a word line of a second port, a bit line of the second port, an inverse bit line of the second port, and a latching circuit, wherein an output terminal of the latching circuit is coupled to the bit line of the first port, and the bit line of the second port, and an inverse output terminal of the latching circuit is coupled to the inverse bit line of the first port, and the inverse bit line of the second port; and a circuit for mitigating write disturbance, comprising:
a first discharge control path including a transistor m1 and a transistor m2, wherein the transistor m1 includes a first terminal connected to the bit line of the second port and a control terminal connected to a first control line, wherein the transistor m2 includes a first terminal connected to a second terminal of the transistor m1 and a second terminal connected to the bit line of the first port and a control terminal connected to the inverse bit line of the first port, and wherein a first discharge current flowing from the bit line of the second port to a low level voltage is generated when the bit line of the second port is at a high level voltage, the bit line of the first port is at the low level voltage, and the first control line operates; and a second discharge control path, connected to the inverse bit line of the second port, the inverse bit line of the first port, and the first control line, wherein a second discharge current flowing from the inverse bit line of the second port to the low level voltage is generated when the inverse bit line of the second port is at the high level voltage, the inverse bit line of the first port is at the low level voltage, and the first control line operates.

2. The dual-port SRAM as claimed in claim 1, wherein the first control line is a write enable control line of the first port, or a row address control line of the first port.

3. The dual-port SRAM as claimed in claim 1, wherein the second discharge control path comprises:
a transistor m3, with a first terminal connected to the inverse bit line of the second port, and a control terminal connected to the first control line; and
a transistor m4, with a first terminal connected to a second terminal of the transistor m3, a second terminal connected to the inverse bit line of the first port, and a control terminal connected to the bit line of the first port.

4. A dual-port static random access memory (SRAM), comprising:
a memory cell comprising a word line of a first port, a bit line of the first port, an inverse bit line of the first port, a word line of a second port, a bit line of the second port, an inverse bit line of the second port, and a latching circuit, wherein an output terminal of the latching circuit is coupled to the bit line of the first port, and the bit line of the second port, and an inverse output terminal of the latching circuit is coupled to the inverse bit line of the first port, and the inverse bit line of the second port; and a circuit for mitigating write disturbance, comprising:
a first discharge control path, connected to the bit line of the second port, the bit line of the first port, and a first control line, wherein a first discharge current flowing from the bit line of the second port to a low level voltage is generated when the bit line of the second port is at a high level voltage, the bit line of the first port is at the low level voltage, and the first control line operates;

a second discharge control path, connected to the inverse bit line of the second port, the inverse bit line of the first port, and the first control line, wherein a second discharge current flowing from the inverse bit line of the second port to the low level voltage is generated when the inverse bit line of the second port is at the high level voltage, the inverse bit line of the first port is at the low level voltage, and the first control line operates;

a third discharge control path, connected to the bit line of the second port, the bit line of the first port, and a second control line, wherein a third discharge current flowing from the bit line of the first port to the low level voltage is generated when the bit line of the second port is at the low level voltage, the bit line of the first port is at the high level voltage, and the second control line operates; and a fourth discharge control path, connected to the inverse bit line of the second port, the inverse bit line of the first port, and the second control line, wherein a fourth discharge current flowing from the inverse bit line of the first port to the low level voltage is generated when the inverse bit line of the second port is at the low level voltage, the inverse bit line of the first port is at the high level voltage, and the second control line operates.

5. The dual-port SRAM as claimed in claim 4, wherein the second control line is a write enable control line of the second port, or a row address control line of the second port.

6. The dual-port SRAM as claimed in claim 4, wherein the third discharge control path comprises:
a transistor m5, with a first terminal connected to the bit line of the first port, and a control terminal connected to the second control line; and
a transistor m6, with a first terminal connected to a second terminal of the transistor m5, a second terminal connected to the bit line of the second port, and a control terminal connected to the inverse bit line of the second port.

7. The dual-port SRAM as claimed in claim 6, wherein the fourth discharge control path comprises:
a transistor m7, with a first terminal connected to the inverse bit line of the first port, and a control terminal connected to the second control line; and
a transistor m8, with a first terminal connected to a second terminal of the transistor m7, a second terminal connected to the inverse bit line of the second port, and a control terminal connected to the bit line of the second port.

8. The dual-port SRAM as claimed in claim 4, wherein the memory cell further comprises: a first pass gate of the first port, a second pass gate of the first port, a first pass gate of the second port, and a second pass gate of the second port, wherein
the first pass gate of the first port is connected between the output terminal of the latching circuit, and the bit line of the first port, wherein a control terminal of the first pass gate of the first port is connected to the word line of the first port;
the second pass gate of the first port is connected between the inverse output terminal of the latching circuit, and the inverse bit line of the first port, wherein a control terminal of the second pass gate of the first port is connected to the word line of the first port;
the first pass gate of the second port is connected between the output terminal of the latching circuit, and the bit line of the second port, wherein a control terminal of the first pass gate of the second port is connected to the word line of the second port; and the second pass gate of the second port is connected between the inverse output terminal of the latching circuit, and the inverse bit line of the second port, wherein a control terminal of the second pass gate of the second port is connected to the word line of the second port.

* * * * *